United States Patent
Chen et al.

(10) Patent No.: US 11,307,219 B2
(45) Date of Patent: Apr. 19, 2022

(54) METHOD AND SYSTEM FOR ANALYZING SPATIAL RESOLUTION OF MICROWAVE NEAR-FIELD PROBE AND MICROWAVE MICROSCOPE EQUIPPED WITH THE SYSTEM

(71) Applicant: Xidian University, Xi'an (CN)

(72) Inventors: Xiaolong Chen, Xi'an (CN); Jia Sun, Xi'an (CN); Kai Yang, Xi'an (CN); Zhimin Liu, Xi'an (CN)

(73) Assignee: Xidian University, Xi'an (CN)

( * ) Notice: Subject to any disclaimer, the term of this patent is extended or adjusted under 35 U.S.C. 154(b) by 0 days.

(21) Appl. No.: 17/227,518

(22) Filed: Apr. 12, 2021

(65) Prior Publication Data
US 2021/0333305 A1 Oct. 28, 2021

(30) Foreign Application Priority Data
Apr. 12, 2020 (CN) .......................... 202010282754.6

(51) Int. Cl.
*G01Q 60/22* (2010.01)
*G01Q 30/04* (2010.01)

(52) U.S. Cl.
CPC ............ *G01Q 60/22* (2013.01); *G01Q 30/04* (2013.01)

(58) Field of Classification Search
CPC ................ G01Q 60/22; G01Q 30/04
USPC ............................................. 850/30, 31, 32
See application file for complete search history.

(56) References Cited

U.S. PATENT DOCUMENTS

| | | | |
|---|---|---|---|
| 9,971,000 B2* | 5/2018 | Bohi ..................... | G01R 33/10 |
| 2008/0135749 A1* | 6/2008 | van der Weide ...... | G01Q 60/38 250/306 |
| 2017/0227636 A1* | 8/2017 | Moulder .................. | G01V 3/12 |
| 2020/0209171 A1* | 7/2020 | Abou-Khousa .......... | H04N 5/30 |

* cited by examiner

*Primary Examiner* — Nicole M Ippolito
(74) *Attorney, Agent, or Firm* — Troutman Pepper Hamilton Sanders LLP; Christopher C. Close, Jr.

(57) ABSTRACT

The present disclosure relates to the technical field of microwave test, and discloses a method and a system for analyzing the spatial resolution of a microwave near-field probe and a microwave microscope equipped with the system, wherein in the method for analyzing the spatial resolution of the microwave near-field probe, a three-dimensional equipotential surface in a sample is drawn by using an electric field formula calculated by a quasi-static theory; an equivalent model of a probe sample is established by using finite element analysis software, so as to change material characteristics in the area outside the three-dimensional equipotential surface; by observing the influence of changing materials on the potential distribution in the sample, a near-field action range of the probe is determined, and the spatial resolution of the microwave near-field scanning microscope is analyzed and calculated.

7 Claims, 23 Drawing Sheets

S101 — Drawing the equipotential surface in the sample by MATLAB, and setting the initial potential value to 0.1 V wherein the origin of coordinates represents the contact point between a spherical probe and the sample, the direction where z<0 is the area where the sample is located, and the direction where z>0 is the air part S102 — Determining a range covered by the equipotential surface according to the drawn equipotential surface S103 — Establishing a finite element model in COMSOL, setting unused size information of a sample according to range information contained in the equipotential surface, and comparing the potential distribution before and after the material changing

*Fig. 1*

METHOD AND SYSTEM FOR ANALYZING SPATIAL RESOLUTION OF MICROWAVE NEAR-FIELD PROBE AND MICROWAVE MICROSCOPE EQUIPPED WITH THE SYSTEM

CROSS REFERENCE TO RELATED APPLICATION(S)

This patent application claims the benefit and priority of Chinese Patent Application No. 202010282754.6, filed on Apr. 12, 2020, the disclosure of which is incorporated by reference herein in its entirety as part of the present application.

TECHNICAL FIELD

The present disclosure relates to the technical field of microwave testing, and in particular to a method and a system for analyzing the spatial resolution of a microwave near-field probe and a microwave microscope equipped with the system.

BACKGROUND ART

At present, the image resolution may generally be defined as the minimum sample unit that is observable. In a microwave near-field scanning microscope, the spatial resolution is generally defined as the minimum volume or area that leads to change of the probe response. When the spatial resolution is smaller than this volume or area, the probe is no longer sensitive to properties of a sample material. This concept may be widely used in practice, such as using the Au/C mixture to define the limiting resolution of a scanning electron microscope. Generally, commonly used microwave microscope can only determine the resolution level of the designed microscope through final experimental results. However, the present disclosure provides a method for analyzing and calculating the spatial resolution of the probe at the design phase.

In view of the above analysis, problems and defects existing in the prior art are as follows:

(1) Currently, it is impossible to theoretically derive the factors affecting the probe resolution at the probe design phase.

(2) Currently, it is impossible to theoretically direct the way to improve the probe resolution through design.

The difficulty to solve the above problems and defects is to explain theoretically rather than experimentally what factors affect the spatial resolution of the probe of the microwave near-field scanning microscope.

The significance of solving the above problems and defects lies in that the probe spatial resolution can be preliminarily estimated at the beginning of the probe design. At the phase of probe design, it is possible to theoretically optimize the design as much as possible in order to improve the probe resolution.

SUMMARY

For solving existing problems in the prior art, the present disclosure provides a method and a system for analyzing the spatial resolution of a microwave near-field probe and a microwave microscope equipped with the system.

The present disclosure is implemented in the form of: a method for analyzing the spatial resolution of a microwave near-field probe, wherein in the method for analyzing the spatial resolution of the microwave near-field probe, a three-dimensional equipotential surface in a sample is drawn by using an electric field formula calculated by a quasi-static theory; an equivalent model of a probe sample is established by using finite element analysis software, so as to change material characteristics in the area outside the three-dimensional equipotential surface; by observing the influence of changing materials on the potential distribution in the sample, a near-field action range of the probe is determined, and the spatial resolution of the microwave near-field scanning microscope is analyzed and calculated.

Further, the method for analyzing the spatial resolution of the microwave near-field probe includes:

In the first step, the probe sample of the microscope is modeled by the quasi-static theory, and the potential distributions around the probe tip in the air and in the sample are analyzed respectively by an image charge method; the formula satisfies the near-field potential distribution both in contact and non-contact cases;

In the second step, an equipotential surface with different potential values is drawn according to the formula, and values $Z_I$ and $X_I$ are taken respectively in a Z direction and in an X direction of the equipotential surface. When materials outside the area contained in this equipotential surface are changed and the potential calculated by the finite element analysis software does not change before and after the change, $Z_I$ is the longitudinal resolution of the probe and also the maximum depth that can be detected, and $X_I$ is the transverse resolution of the probe and the region size that can be detected on the horizontal plane;

In the third step, an equivalent model is established for the probe sample by using the finite element analysis software, boundary conditions are set for calculating potential distributions in the air and in the sample in the model, and by respectively changing materials outside the $x > X_I$ and $z > Z_I$ regions, data information of the potential distributions before and after the material change are respectively exported;

In the fourth step, by comparing potential distribution change curves by origin, when the potential distribution curves are consistent before and after the material change, the longitudinal resolution and transverse resolution of the current probe are determined.

Further, in the first step where the probe sample of the microscope is modeled by the quasi-static theory, and the potential distributions around the probe tip in the air and in the sample are analyzed respectively by an image charge method, the formula satisfying the near-field potential distribution both in contact and non-contact cases is:

Potential distribution in the air is:

$$u = \frac{1}{4\pi\varepsilon_0}\sum_{n=1}^{\infty} q_n \frac{1}{[x^2 + y^2 + (z - a_n)^2]^{1/2}} - \frac{m}{4\pi\varepsilon_0}\sum_{n=1}^{\infty} q_n \frac{1}{[x^2 + y^2 + (z + a_n)^2]^{1/2}}$$

Potential distribution in the sample is:

$$u = \frac{1}{2\pi(\varepsilon + \varepsilon_0)}\sum_{n=1}^{\infty} q_n \frac{1}{[x^2 + y^2 + (z - a_n)^2]^{1/2}}$$

Wherein $\varepsilon_0$ is the vacuum dielectric constant, $\varepsilon$ is the dielectric constant of the sample, $q_n$ is the charge amount at the nth mirror image, $a_n$ is the position of the nth image charge, and m is $(\varepsilon-1)/(\varepsilon+1)$.

Further, the formula for drawing the equipotential surface with different potential values in the second step is:

$$u = \frac{1}{2\pi(\varepsilon+\varepsilon_0)} \sum_{n=1}^{\infty} q_n \frac{1}{[x^2 + y^2 + (z-a_n)^2]^{1/2}}$$

Wherein $\varepsilon$ is the dielectric constant of the sample, $q_n$ is the charge amount at the nth mirror image, $a_n$ is the position of the image charge, and m is $(\varepsilon-1)/(\varepsilon+1)$.

Another purpose of the present disclosure is to provide a system for analyzing the spatial resolution of the microwave near-field probe implementing the method for analyzing the spatial resolution of the microwave near-field probe, wherein the system includes:

An equipotential surface acquisition module, which is used for drawing an equipotential surface in a sample by MATLAB;

An equipotential surface range containing module, which is used for determining a range of the equipotential surface according to the drawn equipotential surface;

A potential distribution module, which is used for establishing a finite element model in COMSOL, setting unused size information of a sample according to range information contained in the equipotential surface, and comparing the potential distribution before and after the material changing.

Another purpose of the present disclosure is to provide a microwave microscope which is equipped with the above-mentioned system for analyzing the spatial resolution of the microwave near-field probe.

In combination with all the above-mentioned technical schemes, the present disclosure has the following advantages and positive effects: according to the present disclosure, firstly, a microwave near-field probe interacts with a sample in a near-field area, wherein the near field is a quasi-static field which does not radiate electromagnetic energy outward, so this field is static-like in nature. The tip of the microwave near-field probe is an arc segment with an infinitely small characteristic length, so the probe tip is equivalent to a tiny ball. The measurement focuses on electrical properties of materials herein, so it is to consider the distribution of quasi-static electric field in the near field. An electric field formed at the microwave near-field probe is analyzed by the image charge method. Currently, this is a mainstream method of studying the near-field electric field distribution of the probe. This method of electric field analysis is now further extended to the analysis of the probe spatial resolution. The field in the near-field area at the probe tip can be determined through an electric field distribution formula, so as to draw an equipotential surface in the sample. This equipotential surface is actually an action range of the electric field, and the probe cannot perceive any material property change outside the action range, thereby determining the spatial resolution of the probe.

The present disclosure provides a theoretical basis to direct the design of the microwave near-field probe, so as to improve the spatial resolution of the probe in the design phase; and provides the theoretical calculation of the spatial resolution of the microwave near-field probe used in the prior art to direct the usage of the probe. The present disclosure provides a theoretical method for analyzing the spatial resolution of the microwave near-field probe, directs the design of the microwave near-field probe, so as to optimize the probe spatial resolution at the design stage; theoretically illustrates the factors affecting the probe spatial resolution which are not only related to the probe tip size, but also to the distance between probe samples.

BRIEF DESCRIPTION OF THE DRAWINGS

In order to illustrate the embodiments of the present disclosure or technical schemes more clearly, the accompanying drawings required in the embodiments of the present disclosure will be briefly introduced below. Apparently, the drawings in the following description are only some embodiments of the present disclosure, and those of ordinary skills in the art may obtain other drawings according to these drawings without creative work.

FIG. 1 is a flow chart of a method for analyzing spatial resolution of a microwave near-field probe provided in embodiments of the present disclosure.

1 equipotential surface acquisition module; 2 equipotential surface range containing module; 3 potential distribution module.

Figure 3:
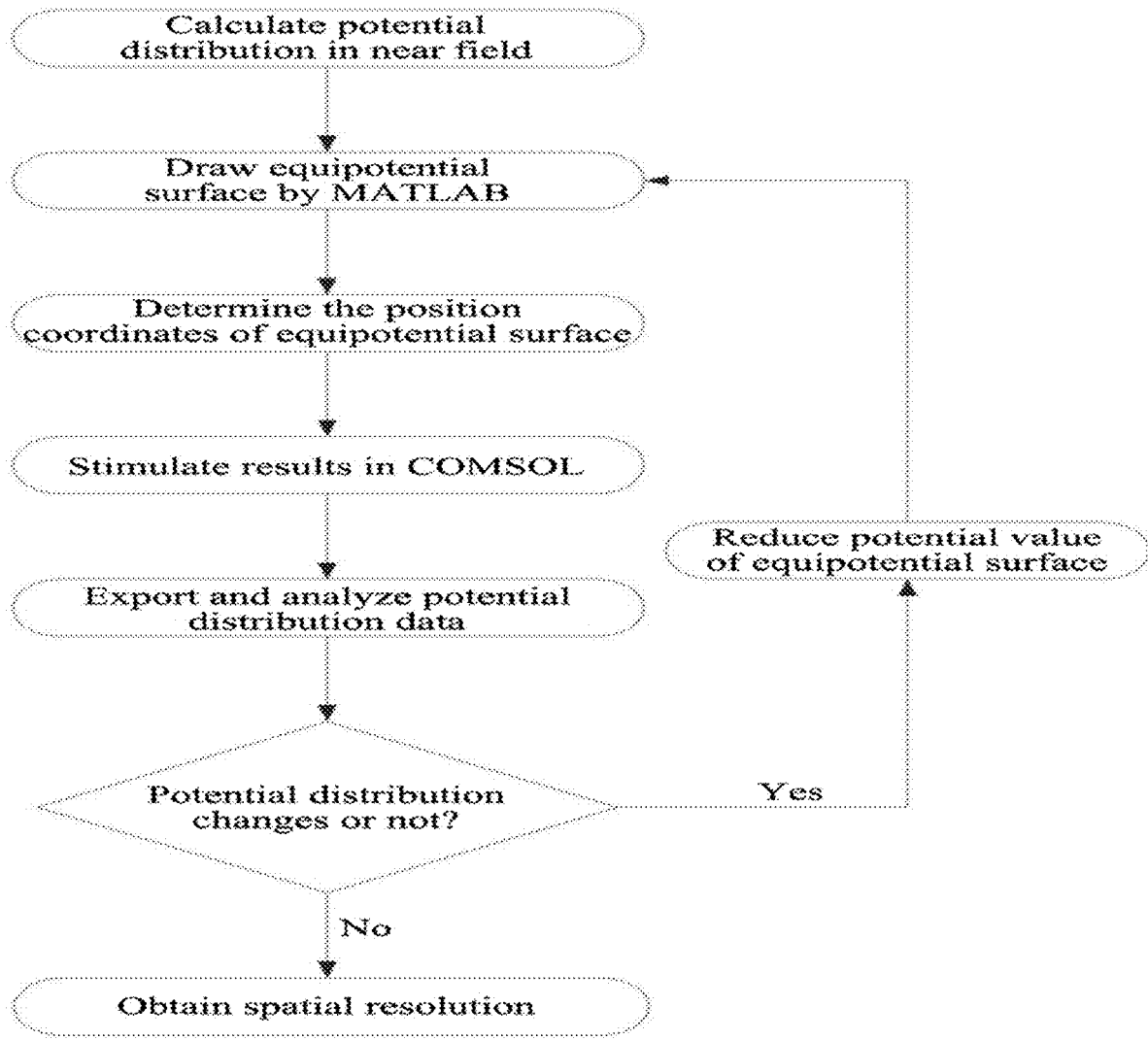

FIG. 3 is a implementation flow chart of a method for analyzing spatial resolution of a microwave near-field probe provided in embodiments of the present disclosure.

Figure 4:
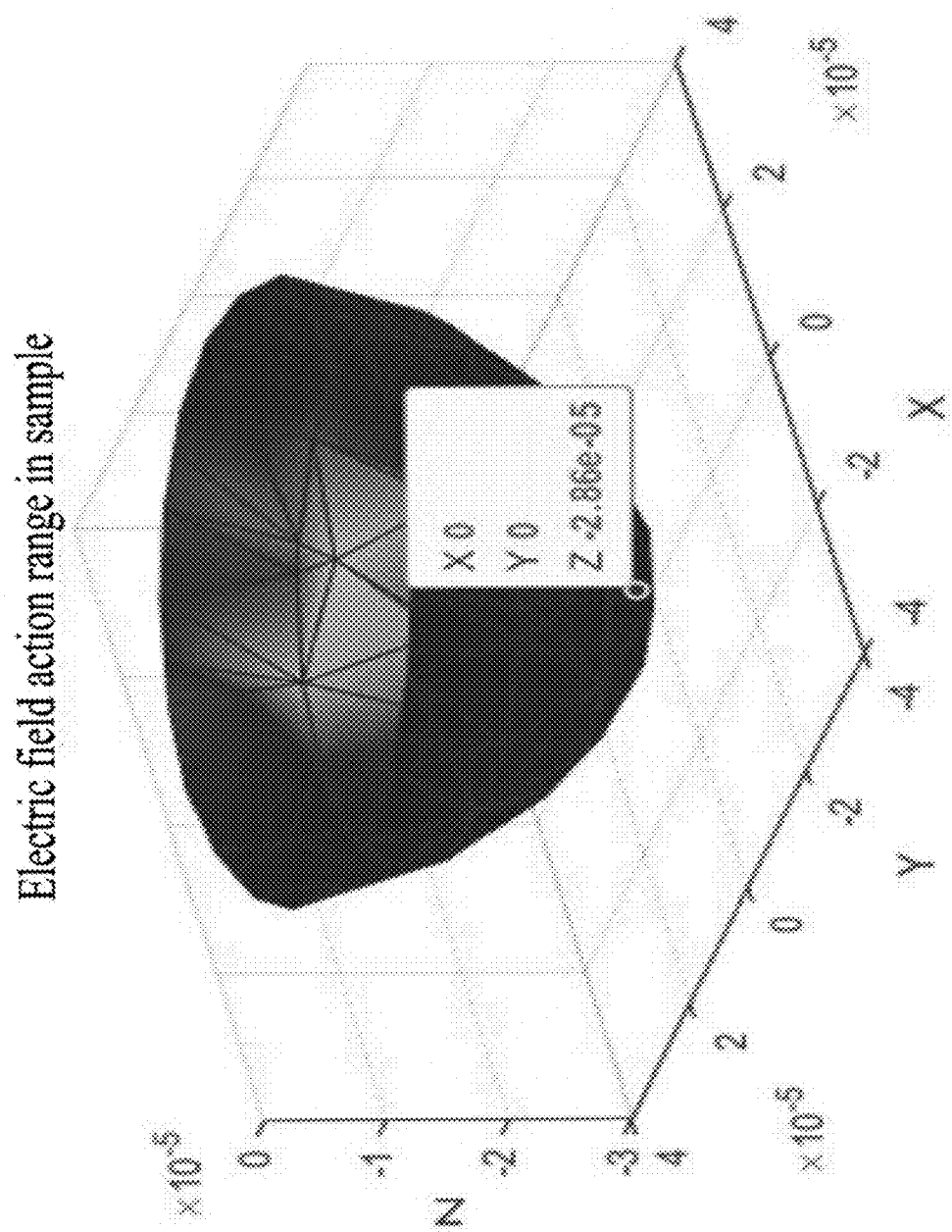

FIG. 4 is a schematic diagram of an equipotential surface at 0.1V in the sample in the contact case provided in embodiments of the present disclosure.

Figure 5A:
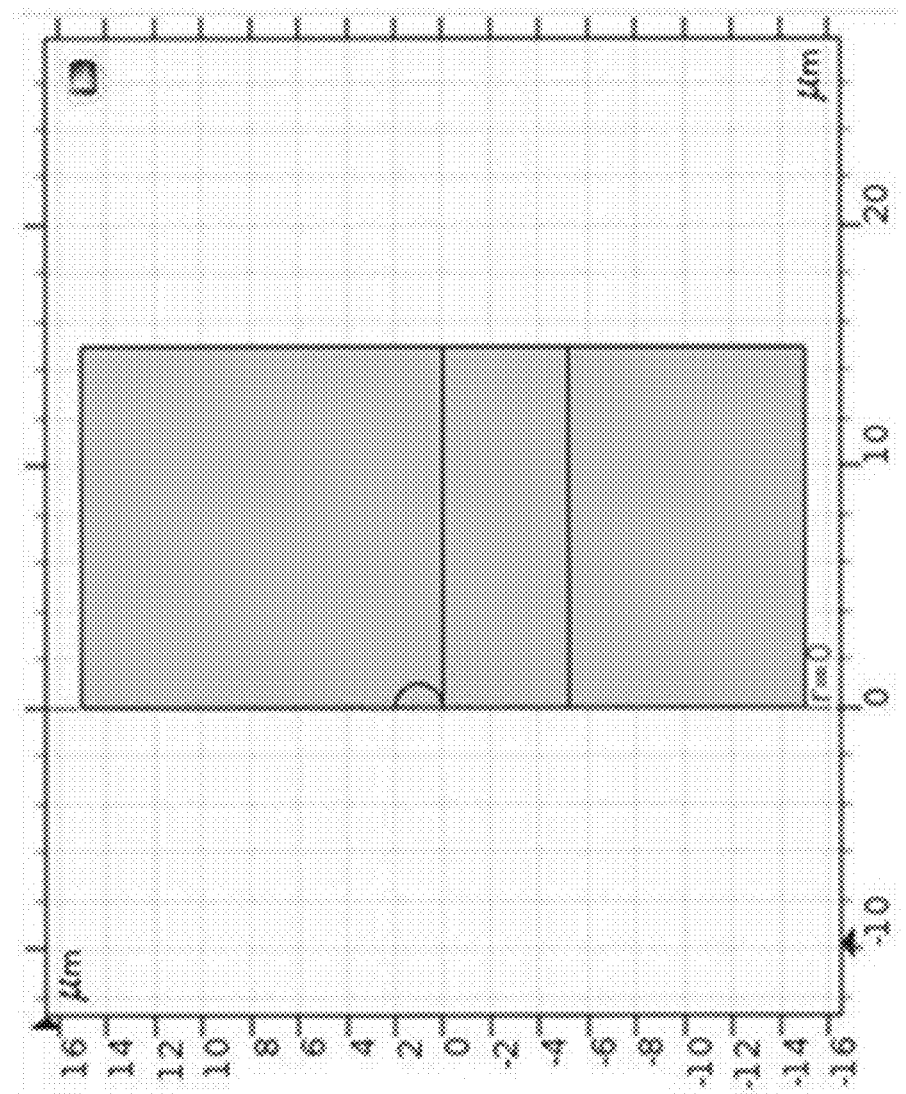
Figure 5B:
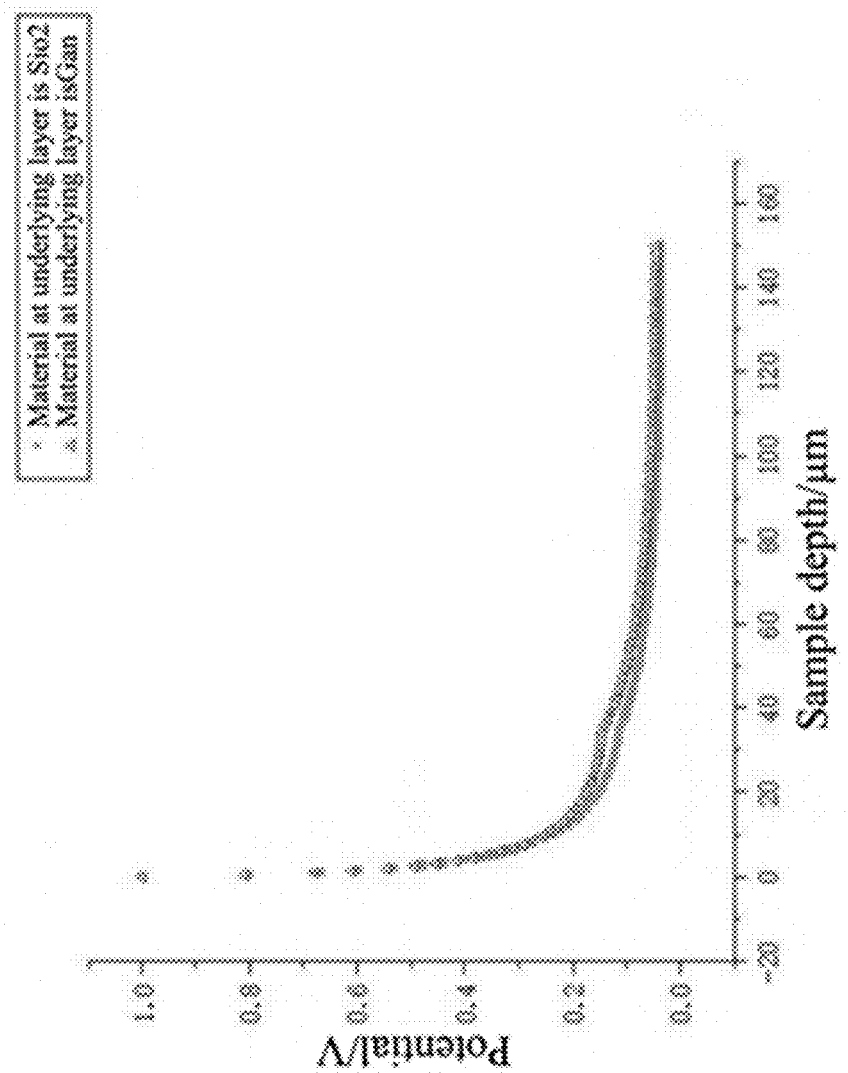

FIG. 5 is a schematic diagram of the influence of potential distribution in the sample due to the underlying material changing provided in embodiments of the present disclosure; wherein:

FIG. 5(a) finite element model; FIG. 5(b) diagram of potential distribution in the sample (in the Z direction).

Figure 6:
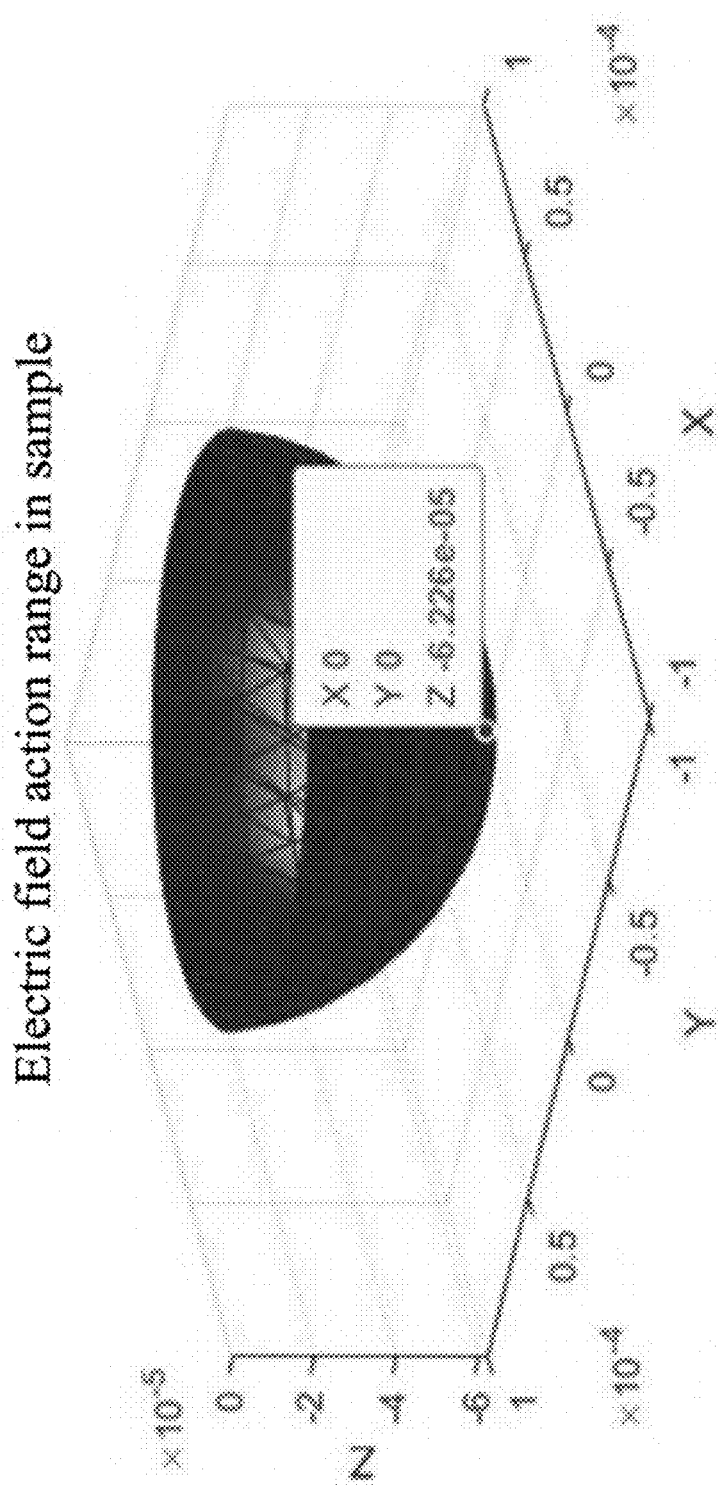

FIG. 6 is a schematic diagram of an equipotential surface at 0.05V in the sample in the contact case provided in embodiments of the present disclosure.

Figure 7:
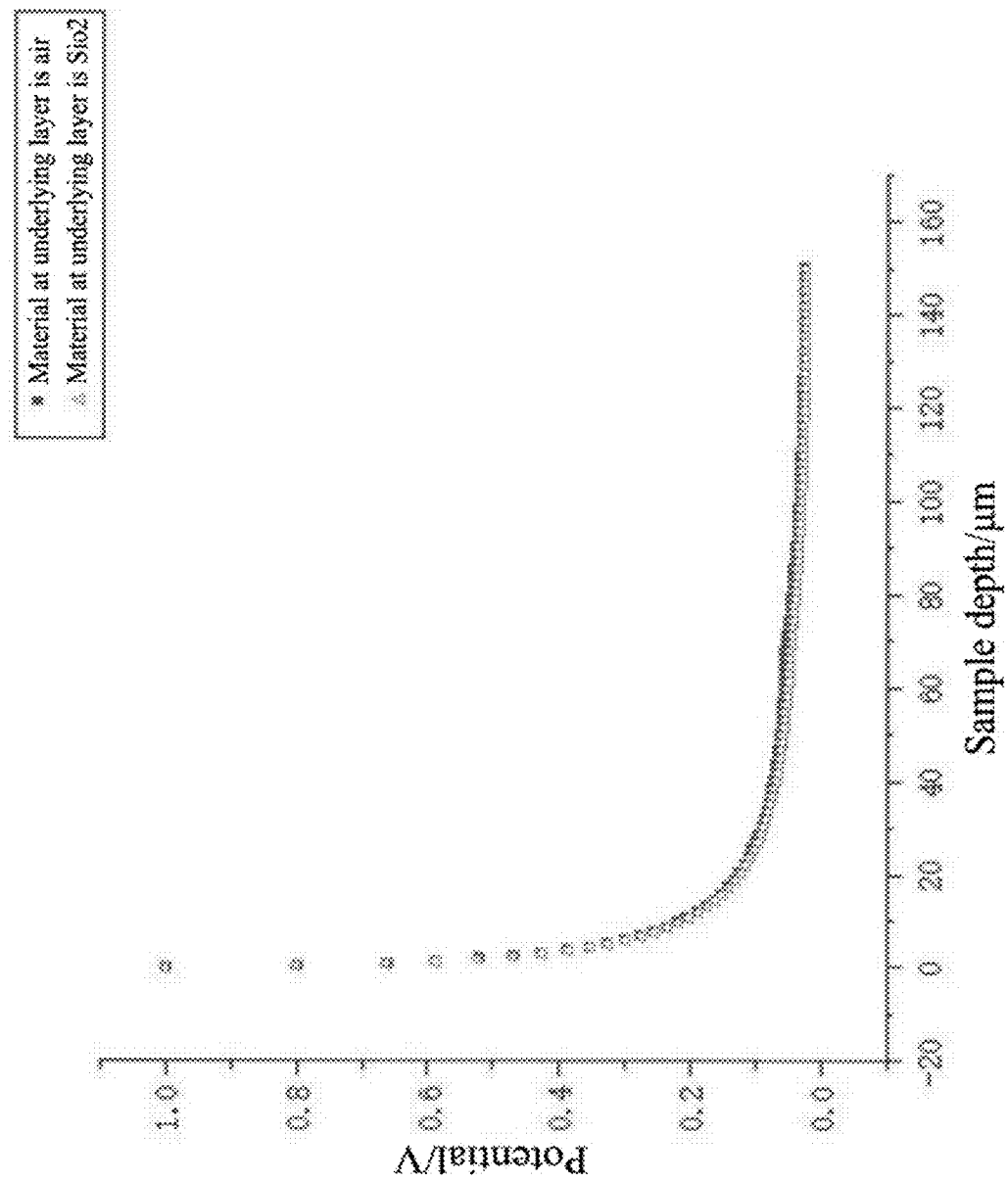

FIG. 7 is a schematic diagram of the potential distribution (in the Z direction) in the sample provided in embodiments of the present disclosure.

Figure 8:
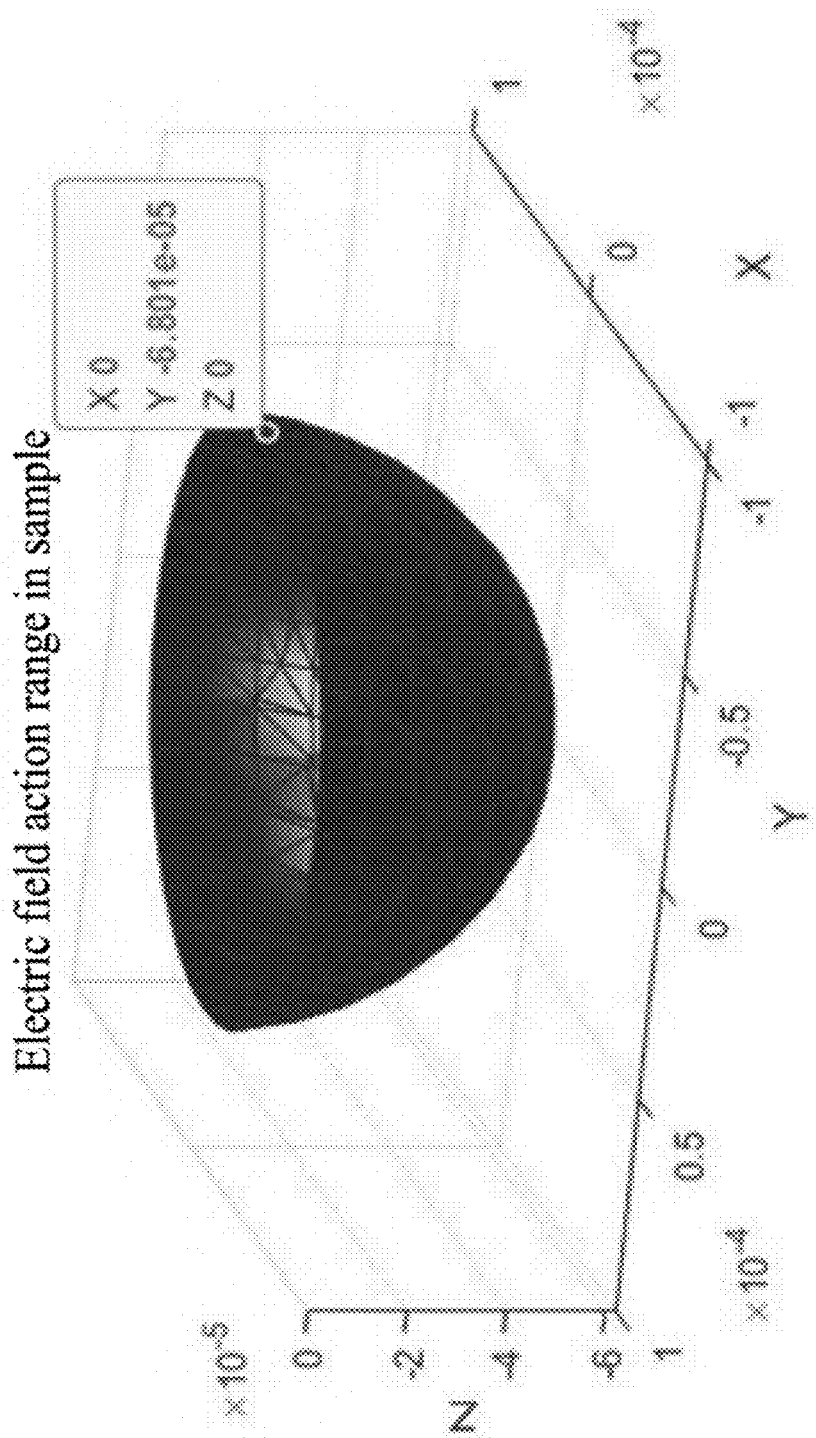

FIG. 8 is a schematic diagram of an equipotential surface at 0.05V in the sample in the contact case provided in embodiments of the present disclosure.

Figure 9A:
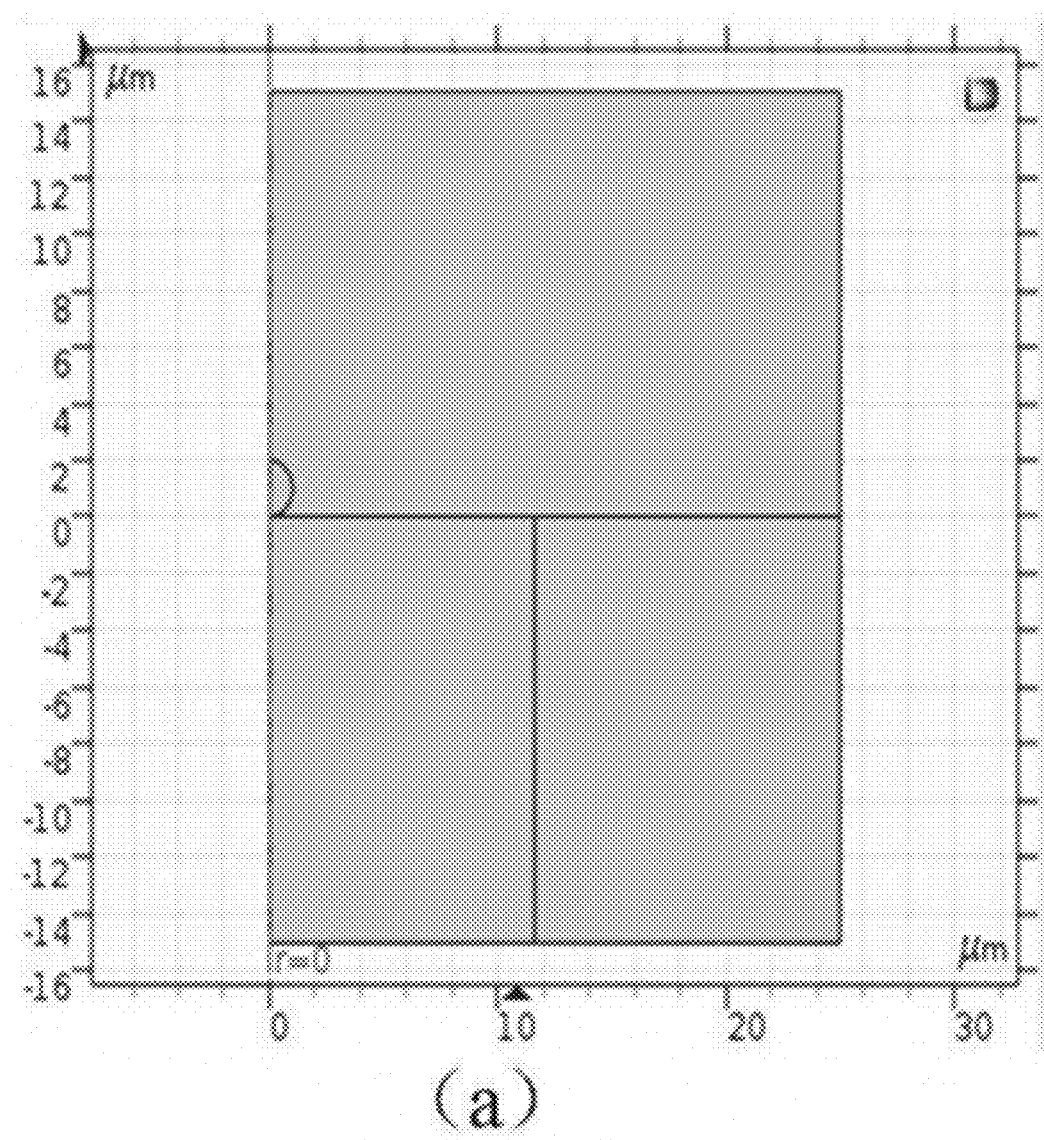
Figure 9B:
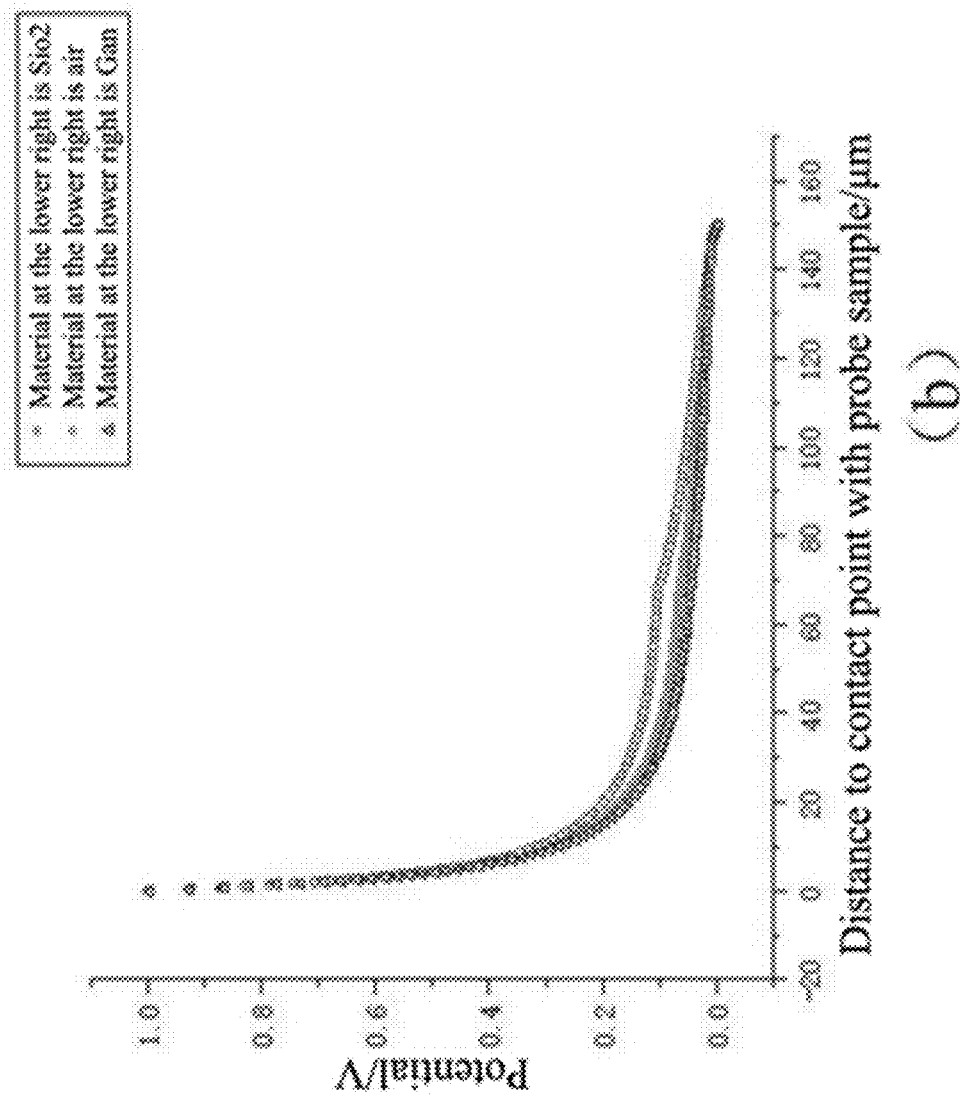

FIG. 9 is a schematic diagram of the potential distribution in the finite element model and on the sample surface provided in embodiments of the present disclosure; wherein FIG. 9(a) finite element model; FIG. 9(b) potential distribution on the sample surface.

Figure 10:
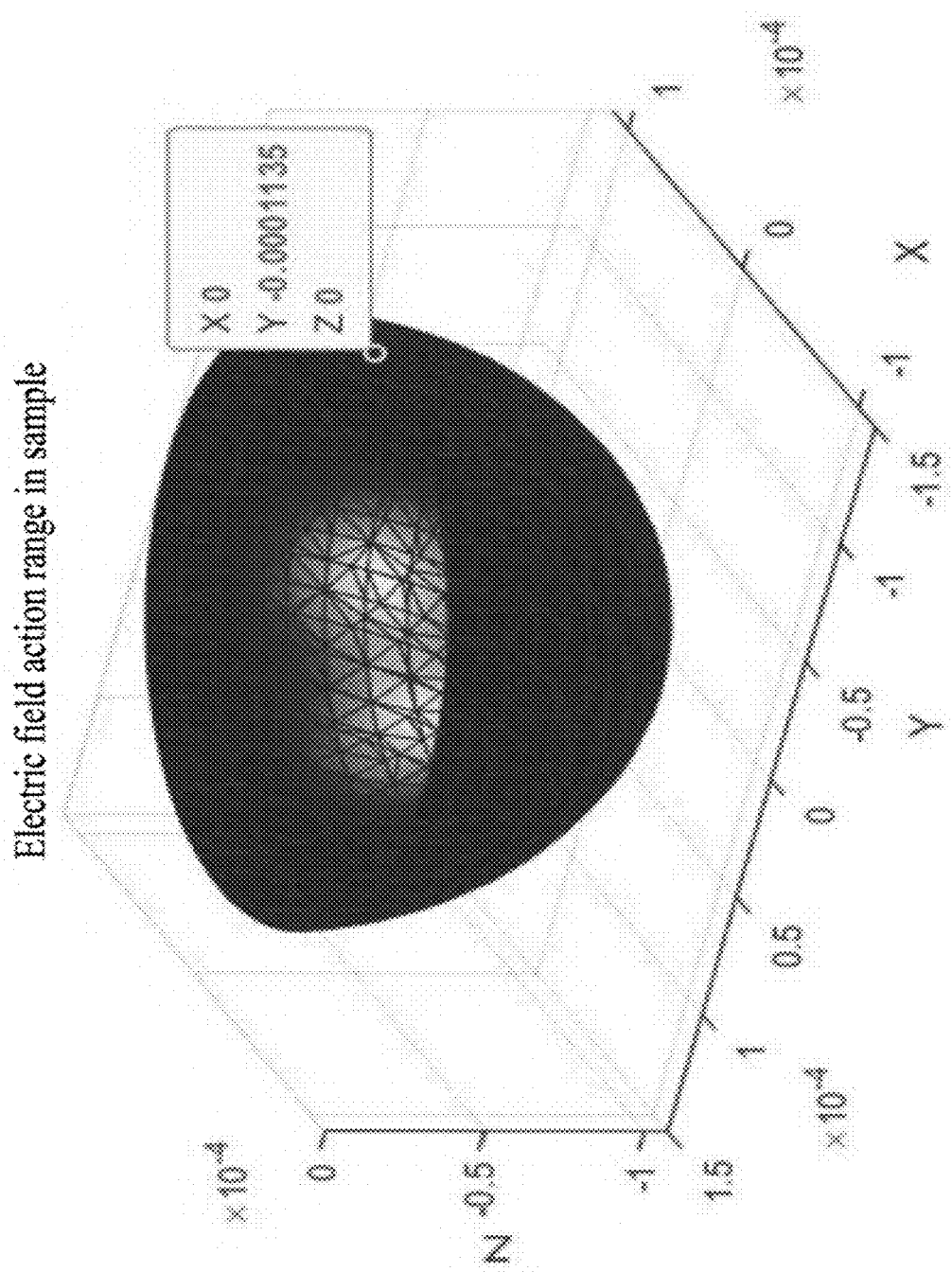

FIG. 10 is a schematic diagram of an equipotential surface at 0.03V in the sample in the contact case provided in embodiments of the present disclosure.

Figure 11:
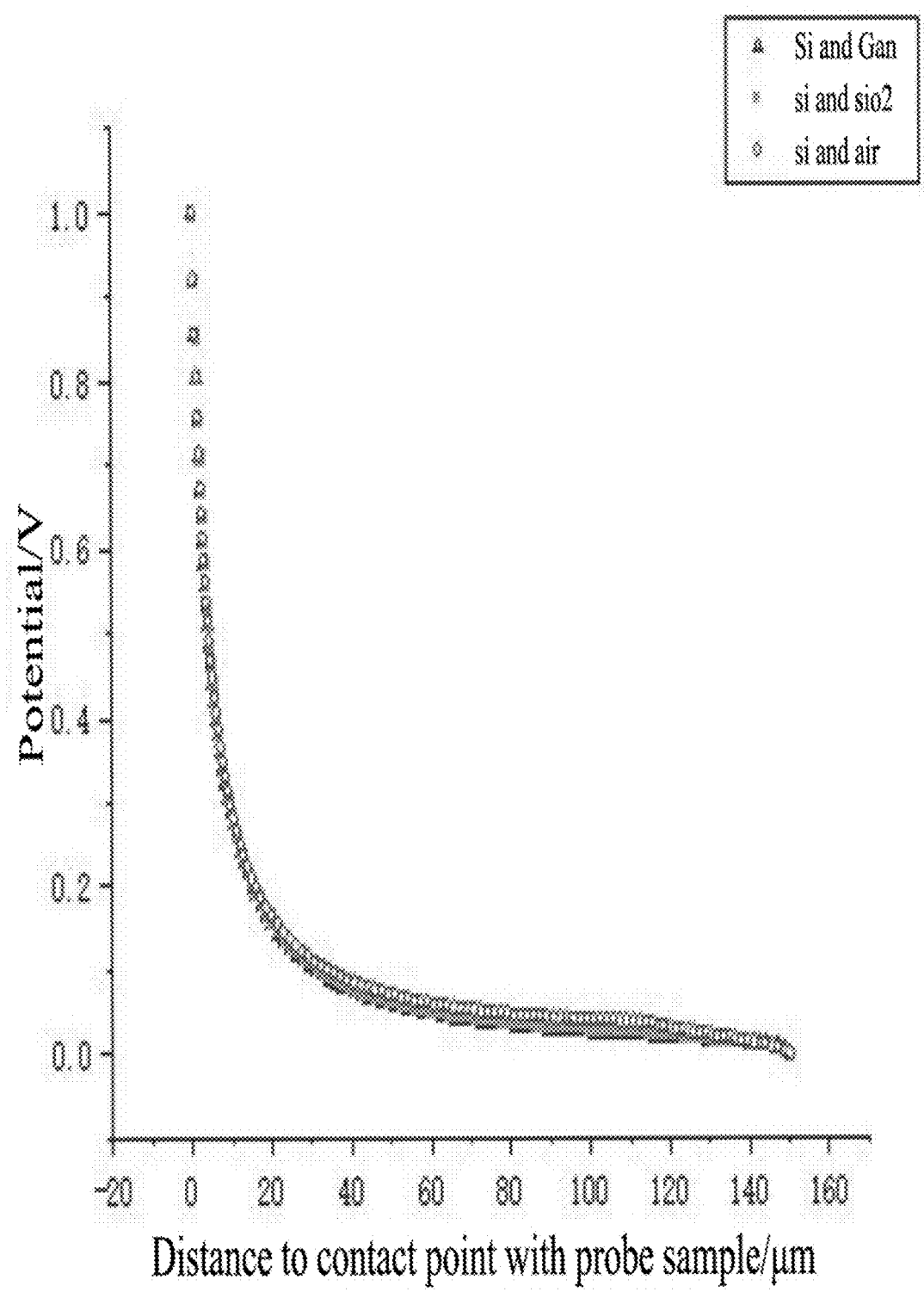

FIG. 11 is a schematic diagram of the influence of potential distribution on the sample surface due to the material changing provided in embodiments of the present disclosure.

Figure 12:
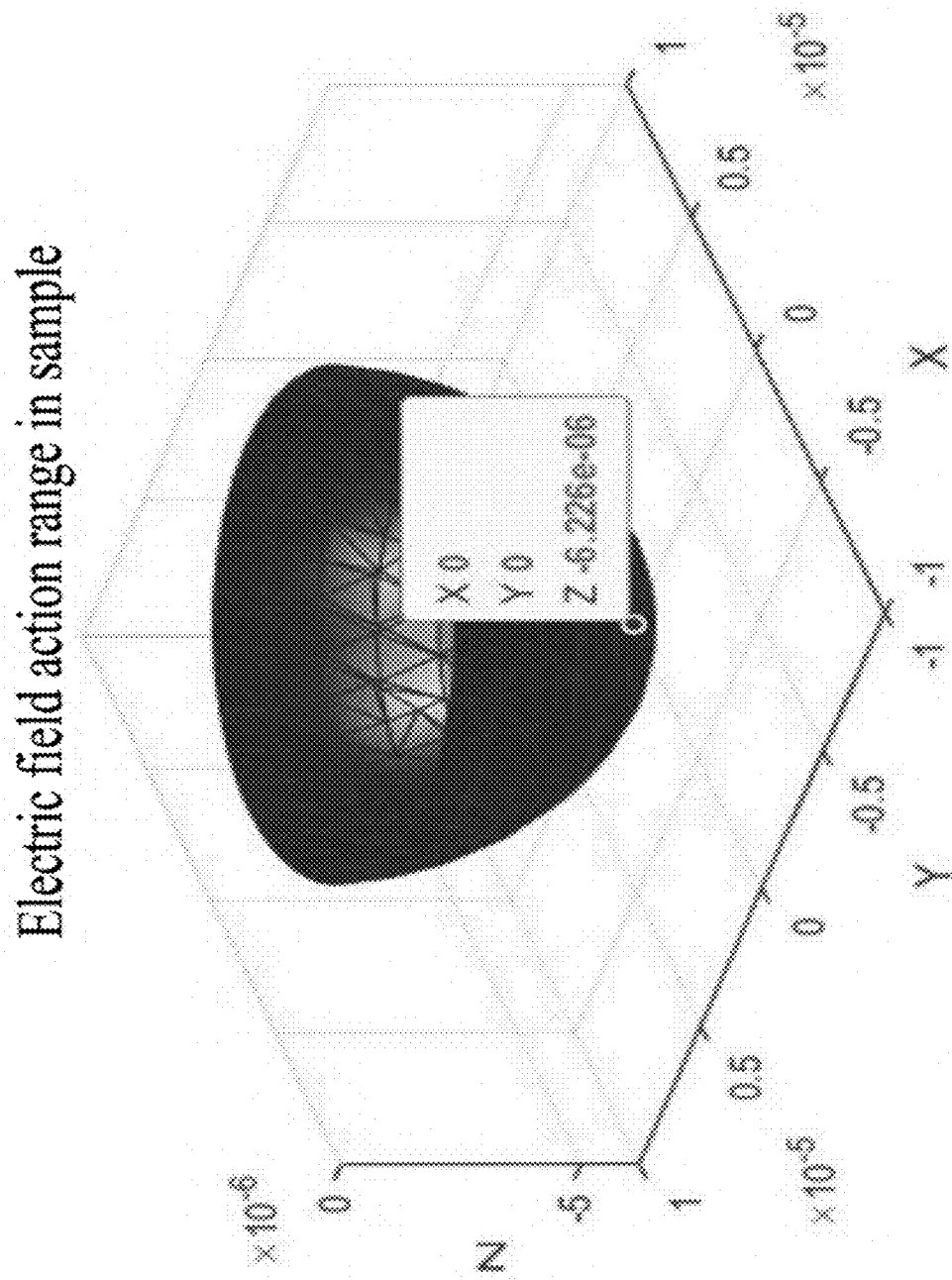

FIG. 12 is a schematic diagram of an equipotential surface position at 0.05V in the non-contact case provided in embodiments of the present disclosure.

Figure 13:
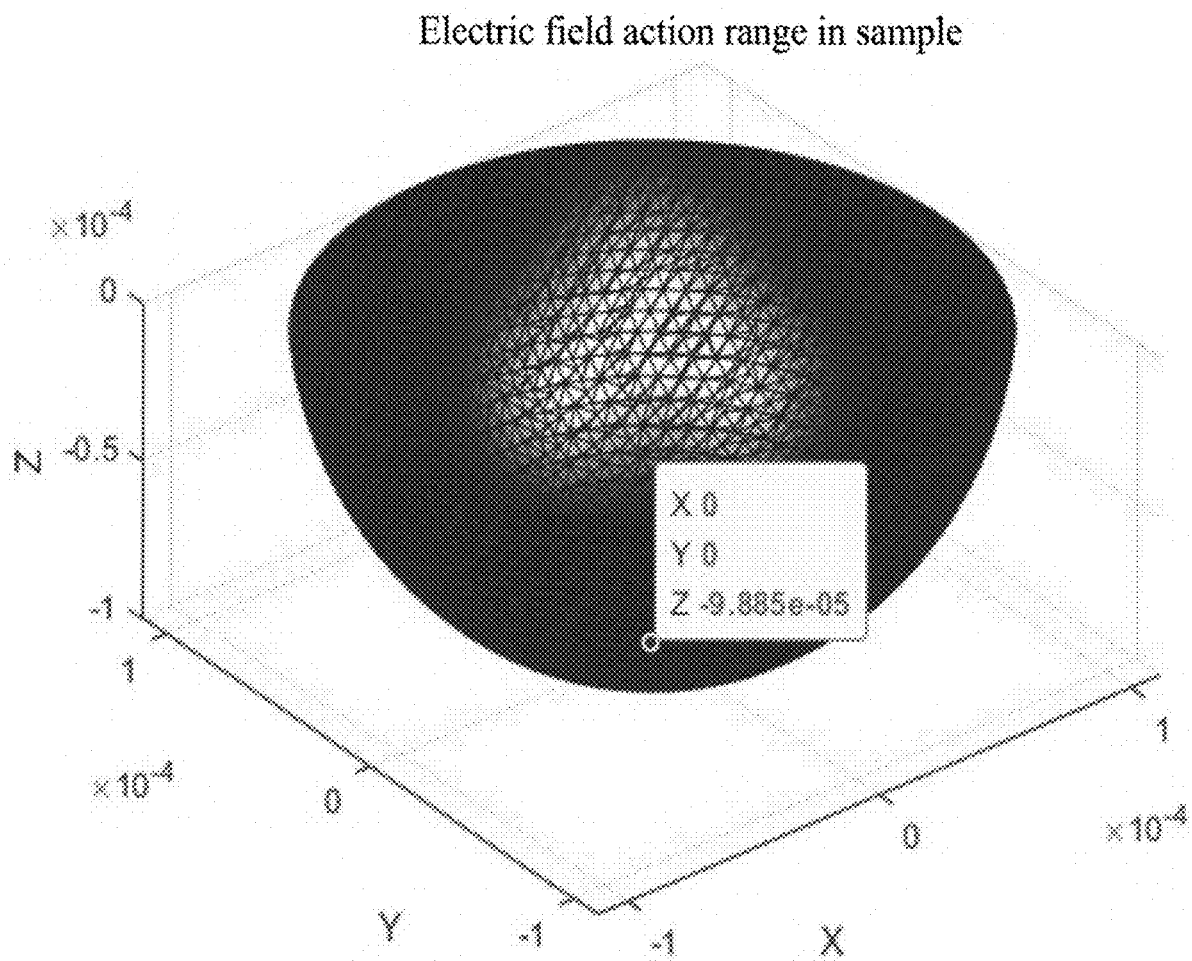

FIG. 13 is a schematic diagram of an equipotential surface position at 0.02V in the sample in the non-contact mode provided in embodiments of the present disclosure.

Figure 14A:
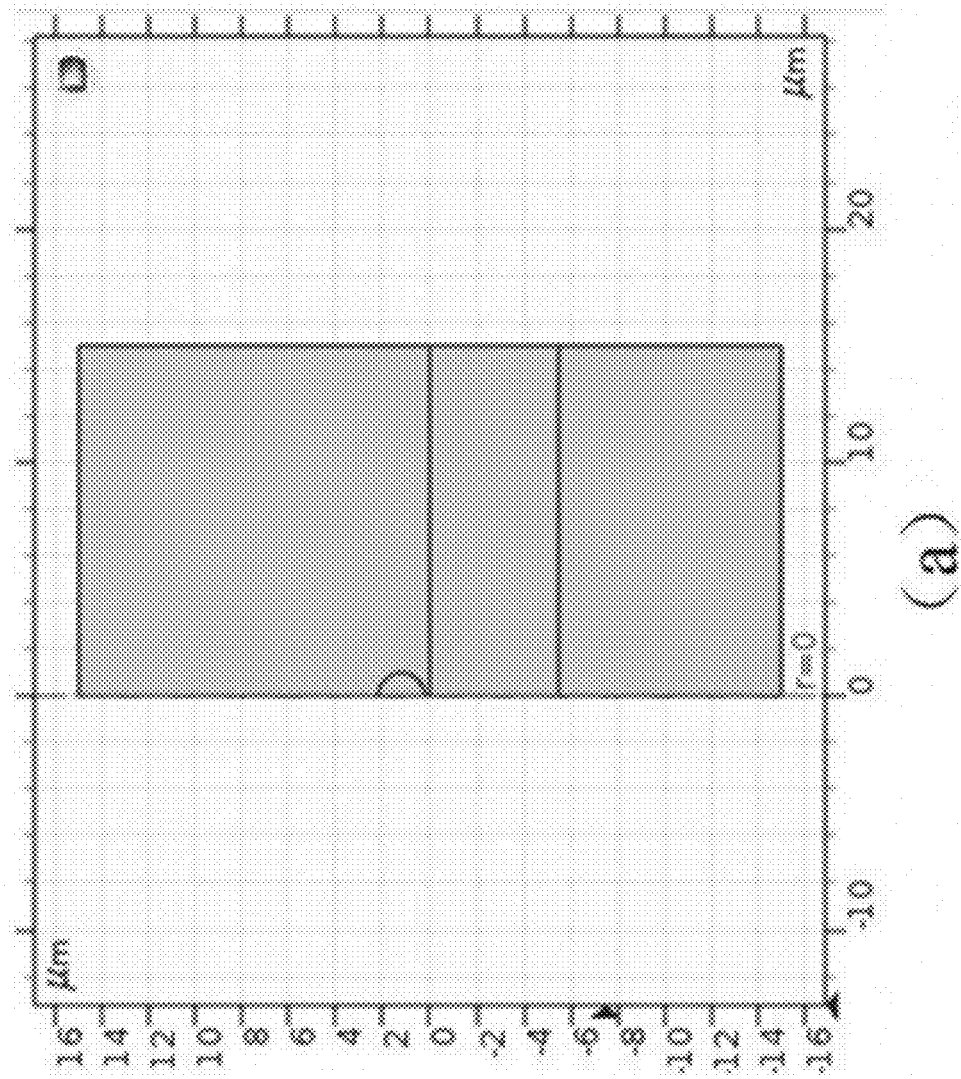
Figure 14B:
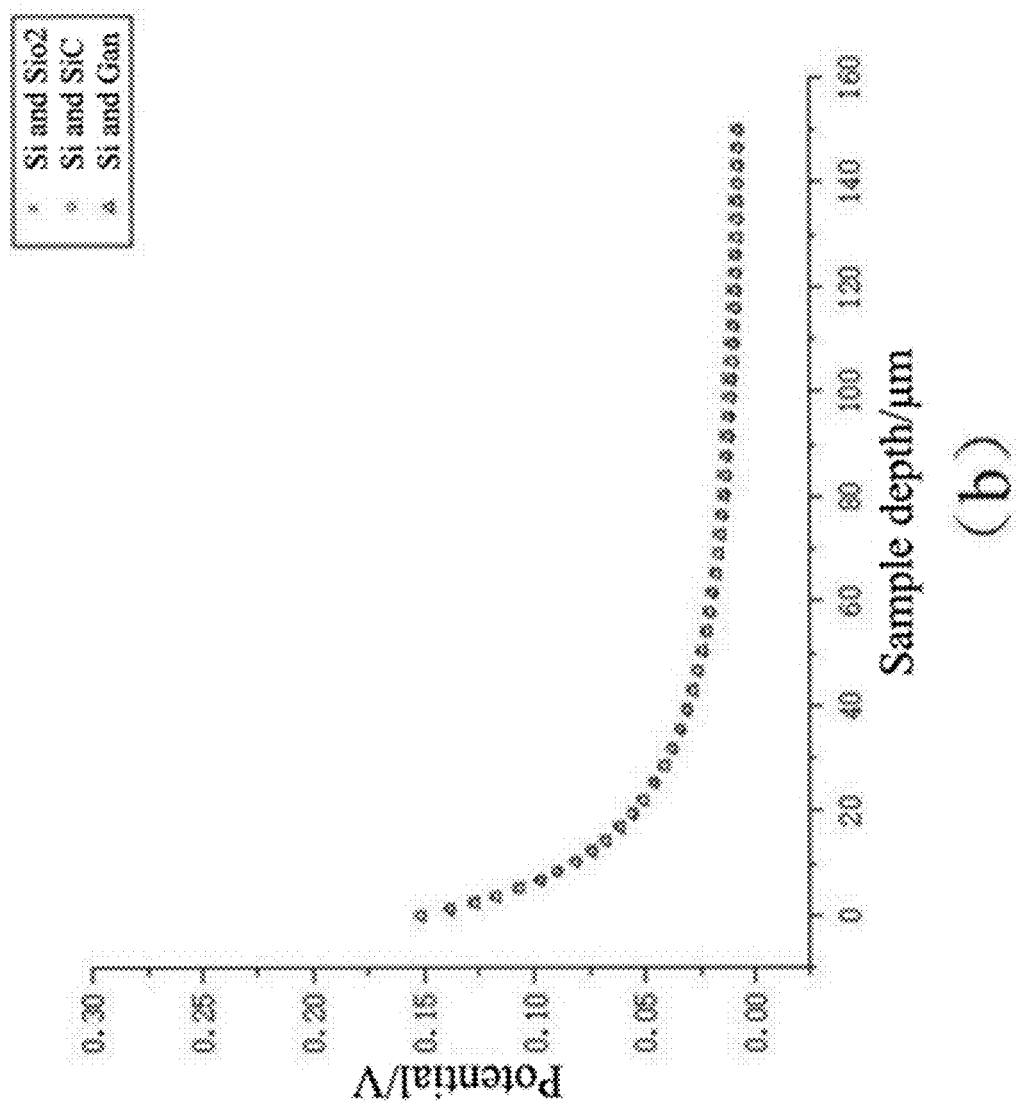

FIG. 14 is a curve diagram of the influence of potential distribution within the sample due to material changing provided in embodiments of the present disclosure; wherein:

FIG. 14(*a*) finite element model; FIG. 14(*b*) potential distribution within the sample.

Figure 15:
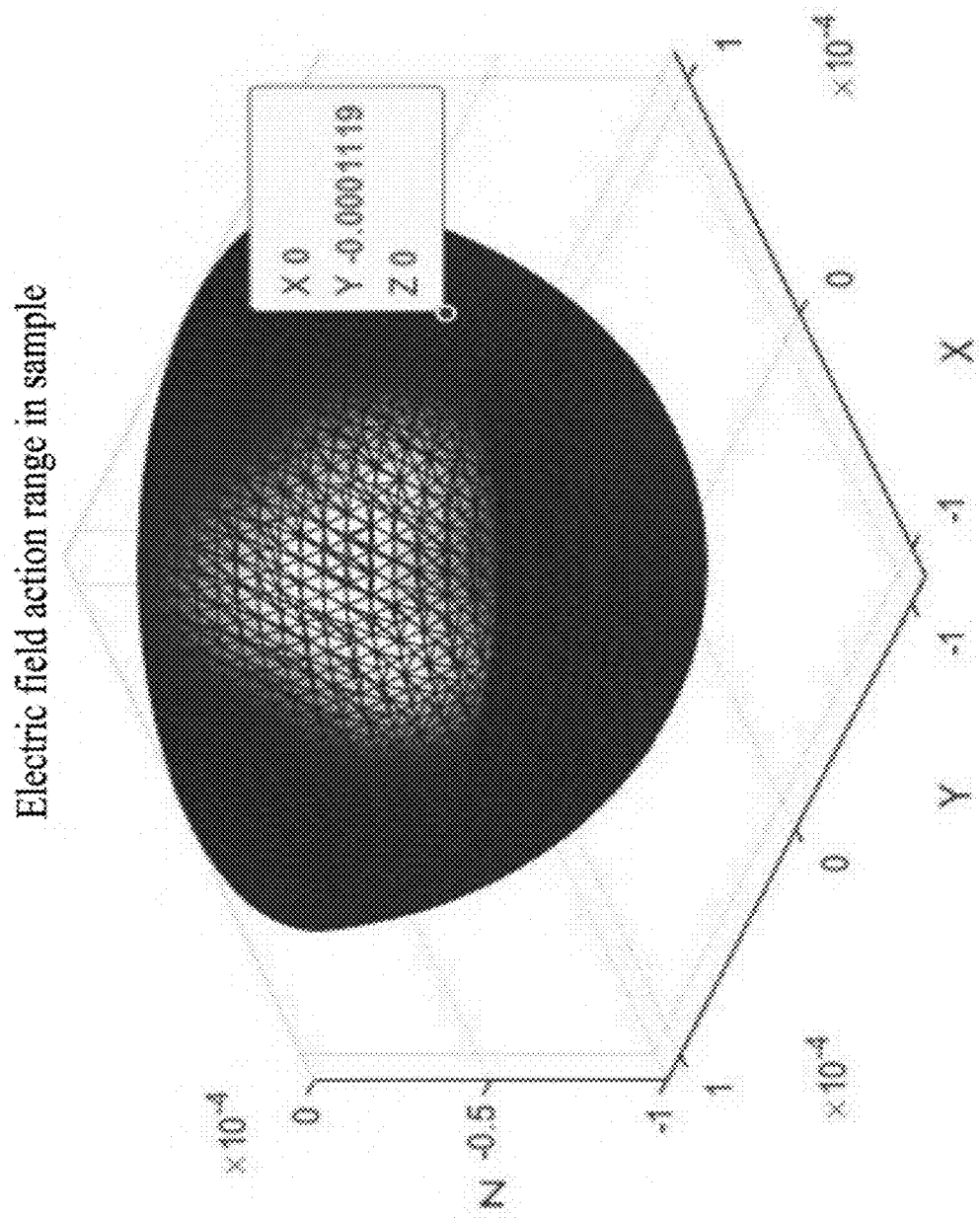

FIG. 15 is a schematic diagram of an equipotential surface at 0.01V in the non-contact mode provided in embodiments of the present disclosure.

Figure 16A:
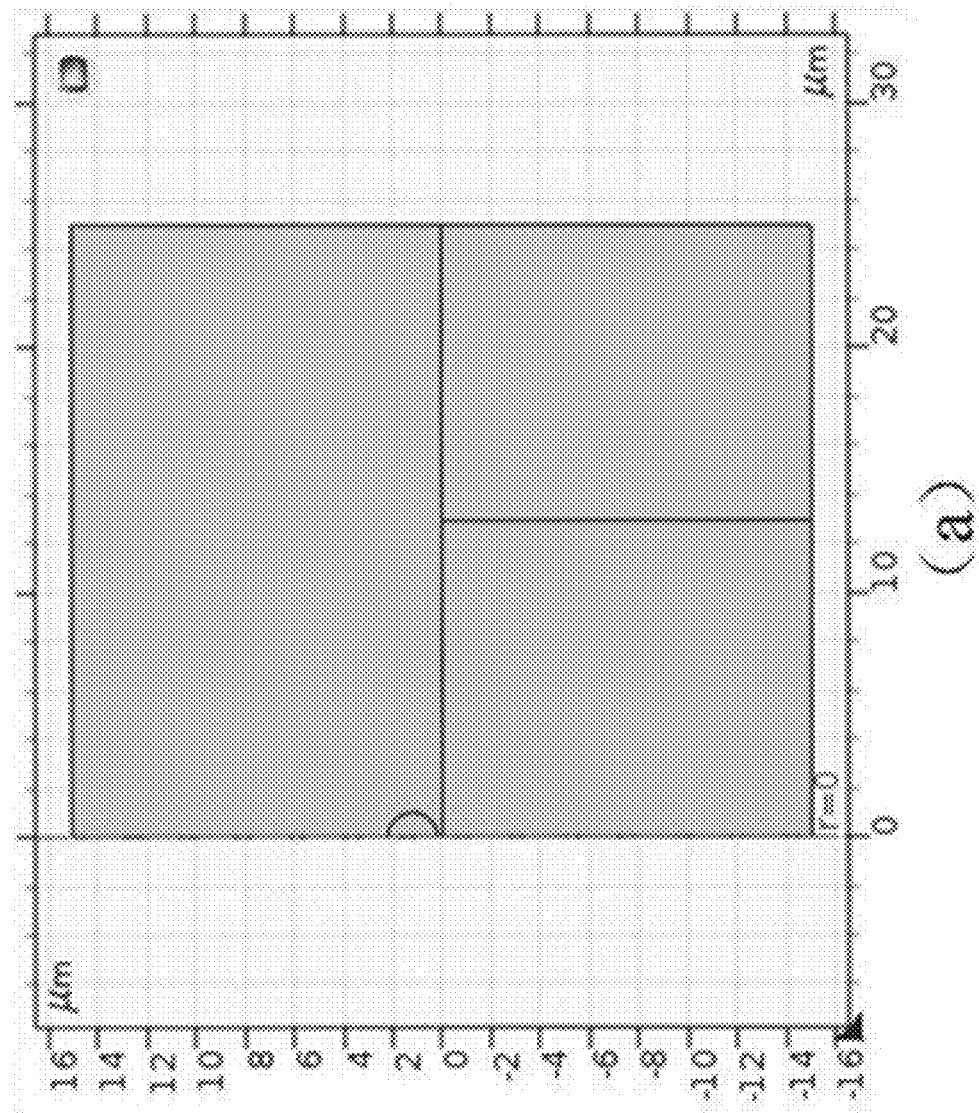
Figure 16B:
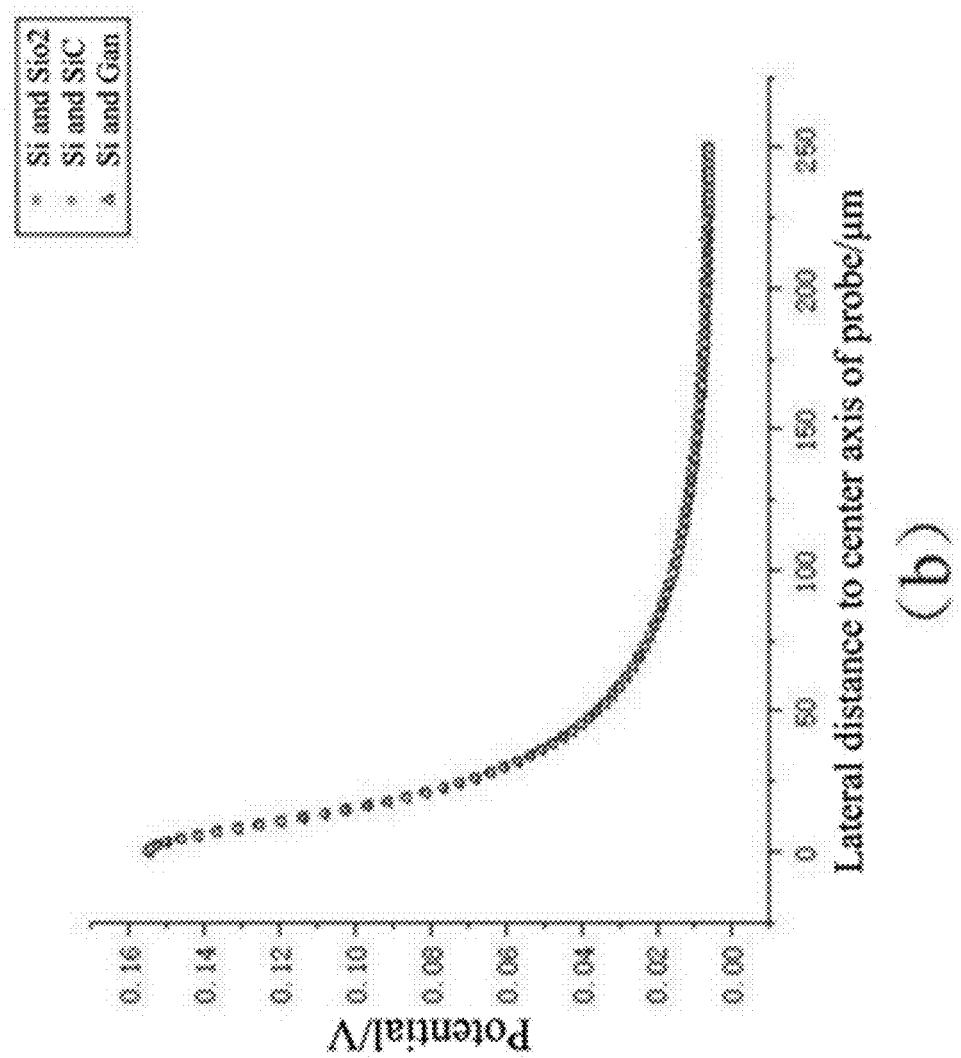

FIG. 16 is a schematic diagram of the influence of potential distribution on the sample surface due to the material changing provided in embodiments of the present disclosure; wherein:

FIG. 16(*a*) finite element model; FIG. 16(*b*) potential distribution on the sample surface.

Figure 17:
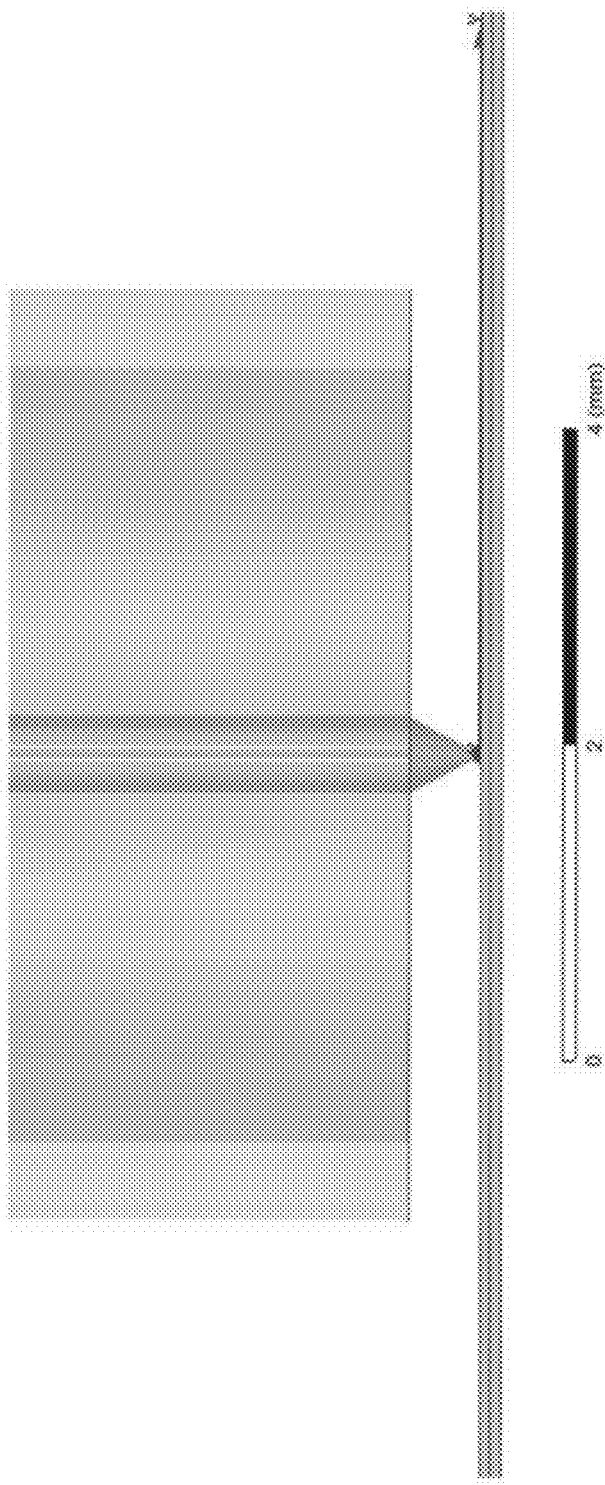

FIG. 17 is a schematic diagram of a coaxial probe model provided in embodiments of the present disclosure.

Figure 18:
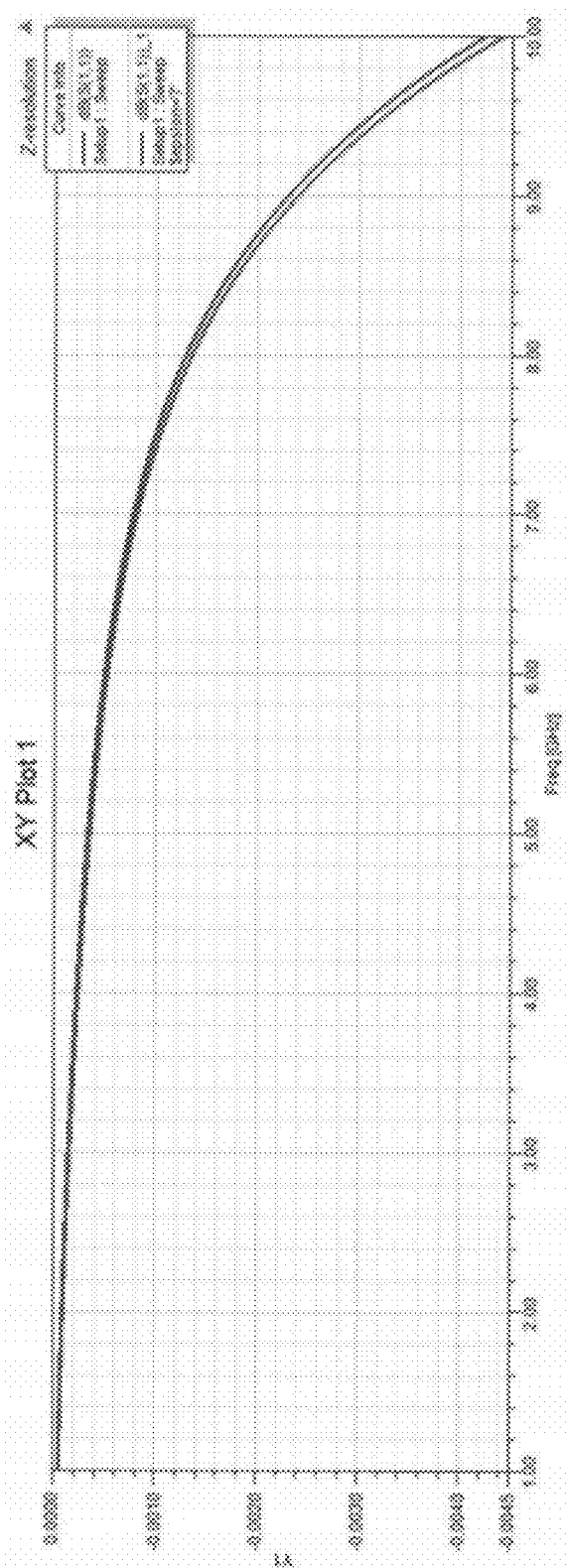

FIG. 18 is a schematic diagram of the reflection coefficient change of the coaxial probe provided in embodiments of the present disclosure.

Figure 19:
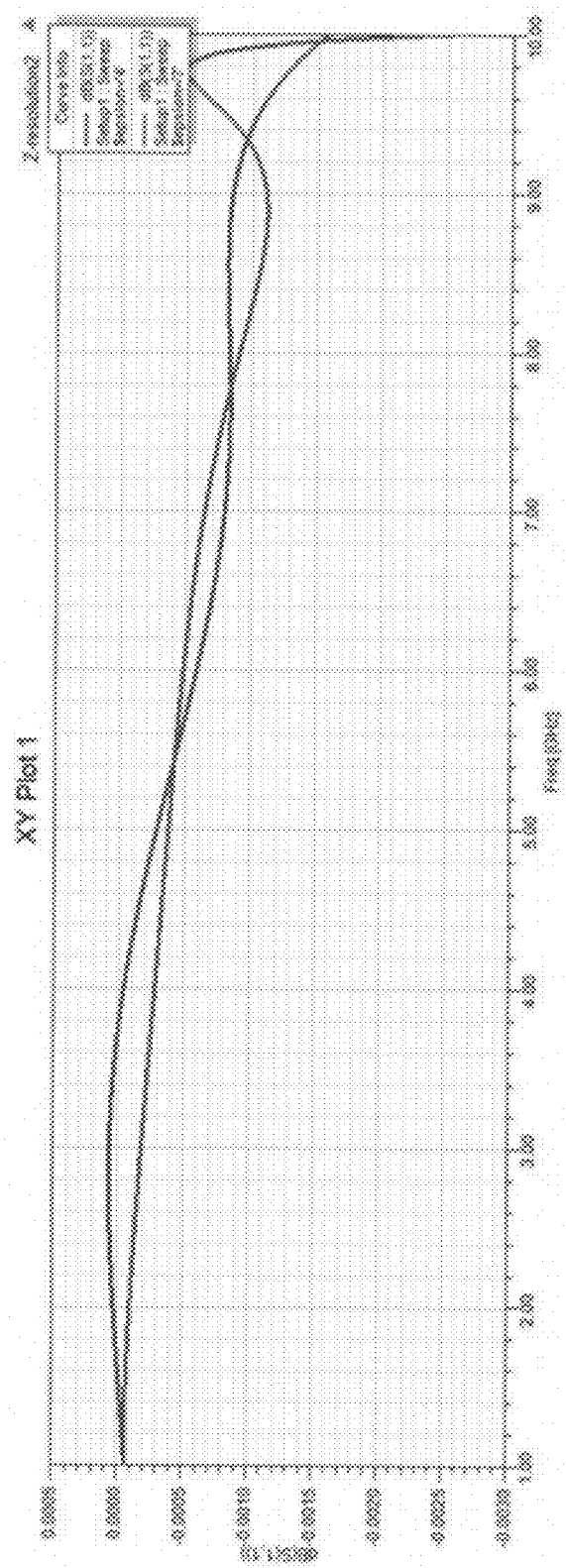

FIG. 19 is a schematic diagram of the reflection coefficient change of the coaxial probe provided in embodiments of the present disclosure.

DETAILED DESCRIPTION OF THE EMBODIMENTS

In order to make the purpose, technical scheme and advantages provided by the present disclosure clearer, the present disclosure will be further described in detail with reference to embodiments below. It should be understood that the specific embodiments described herein are only used to explain the present disclosure without limiting the same.

For solving existing problems in the prior art, the present disclosure provides a method for analyzing the spatial resolution of a microwave near-field probe, which will be described in detail with reference to accompanying figures below. According to the present disclosure, the spatial resolutions of a contact probe and a non-contact probe are analyzed respectively along the same line. Therefore, the present disclosure claims and protects the analysis of spatial resolution in at least two cases: a contact probe and a non-contact probe.

As shown in FIG. 1, the method for analyzing the spatial resolution of the microwave near-field probe provided in the present disclosure includes:

Step 101: drawing the equipotential surface in the sample by MATLAB, and setting the initial potential value to 0.1 V wherein the origin of coordinates represents the contact point between a spherical probe and the sample, the direction where z<0 is the area where the sample is located, and the direction where z>0 is the air part;

Step 102: determining a range of the equipotential surface according to the drawn equipotential surface;

Step 103: establishing a finite element model in COMSOL, setting unused size information of a sample according to range information contained in the equipotential surface, and comparing the potential distribution before and after the material changing.

Figure 2:
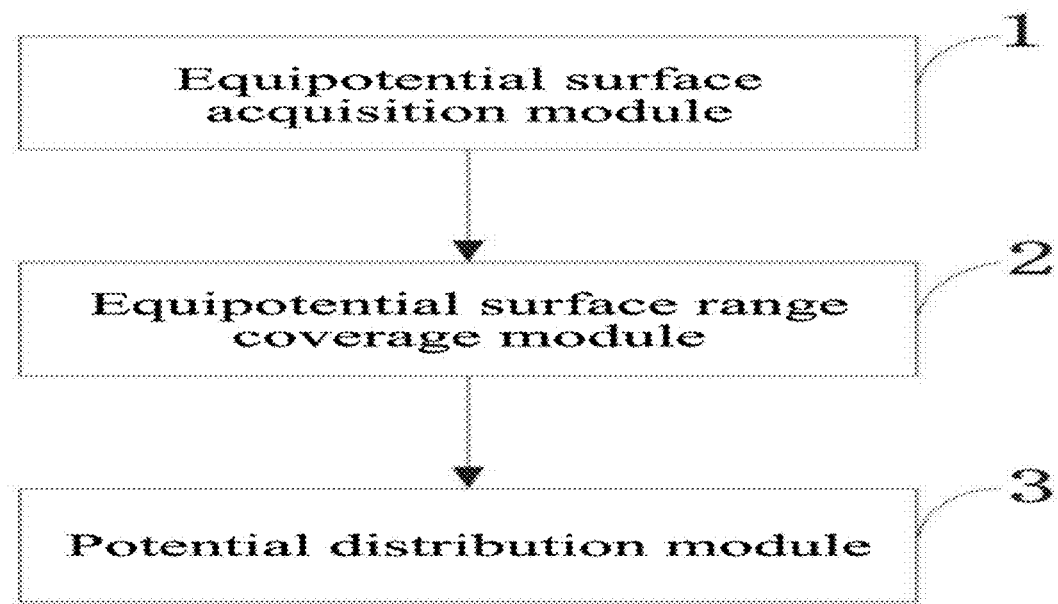
FIG. 2 is a key view of a system for analyzing spatial resolution of a microwave near-field probe provided in embodiments of the present disclosure, which includes.

As shown in FIG. 2, the system for analyzing the spatial resolution of the microwave near-field probe provided in the present disclosure includes:

An equipotential surface acquisition module 1, which is used for drawing an equipotential surface in a sample by MATLAB.

An equipotential surface range containing module 2, which is used for determining a range of the equipotential surface according to the drawn equipotential surface.

A potential distribution module 3, which is used for establishing a finite element model in COMSOL, setting unused size information of a sample according to range information contained in the equipotential surface, and comparing the potential distribution before and after the material changing.

Technical schemes provided in the present disclosure will be further described with reference to accompanying drawings below.

In the present disclosure, according to the definition of the spatial resolution, the spatial resolution refers to the minimum volume or area that leads to the change of the probe response. The spatial resolution is divided into the longitudinal spatial resolution and the transverse spatial resolution, wherein the longitudinal resolution refers to a probe ability of information detection to the depth of a sample, while the transverse resolution refers to the probe ability of discriminating the change of the sample on the horizontal plane.

According to the present disclosure, in order to calculate the potential distribution in the near field at the probe tip, the quasi-static theory is used to equivalently model the probe sample, and the image charge method is used to analyze the potential distribution in the near field of the probe model; wherein the quasi-static theory and the image charge method have been derived in detail.

Potential distribution in the air is:

$$u = \frac{1}{4\pi\varepsilon_0} \sum_{n=1}^{\infty} q_n \frac{1}{[x^2 + y^2 + (z - a_n)^2]^{1/2}} - \frac{m}{4\pi\varepsilon_0} \sum_{n=1}^{\infty} q_n \frac{1}{[x^2 + y^2 + (z + a_n)^2]^{1/2}}$$

Potential distribution in the sample is:

$$u = \frac{1}{2\pi(\varepsilon + \varepsilon_0)} \sum_{n=1}^{\infty} q_n \frac{1}{[x^2 + y^2 + (z - a_n)^2]^{1/2}}$$

Wherein $\varepsilon_0$ is the vacuum dielectric constant, $\varepsilon$ is the dielectric constant of the sample, $q_n$ is the charge amount at the nth mirror image, $a_n$ is the position of the nth image charge, and m is $(\varepsilon-1)/(\varepsilon+1)$.

The potential distribution in the sample can be calculated by using formula (2). Then, it is time to determine the minimum volume or area that leads to the change of the probe response. If the potential distribution in the sample changes, the electrical signal received by the probe will change as well, thus causing a change in response. Therefore, it can be determined whether the probe will change correspondingly by observing whether the potential distribution in the sample changes or not.

Generally, only when the action range of the near field is all covered in a uniform medium can the response signal of the probe uniquely represent such a material. In other words, when the action range of the near field covers one or more media, the response signal of the probe will be the information containing multiple media, and what will be finally obtained is an equivalent parameter of the materials. If it is expected the probe measures characteristic information of a uniform medium, it is necessary to ensure that the area covered by the uniform medium in the sample is at least the minimum range that can be resolved by the probe, namely the range determined by the probe spatial resolution. If the area covered by the uniform medium is smaller than the probe spatial resolution range, then the detection range of the probe includes more than one kind of medium, and the response signal of the probe includes more than the influence of this kind of uniform medium, leading to a great deviation to the measurement result. FIG. 3 shows the method for analyzing the spatial resolution of the probe, which is suitable for contact probes and non-contact probes.

Firstly, an equipotential surface in a sample is drawn by MATLAB. An initial potential value is set to 0.1 V. In the figure which only shows a distribution diagram of the equipotential surface in the sample, the origin of coordinates represents the contact point between a spherical probe and the sample, the direction where z<0 is the area where the sample is located, and the direction where z>0 is the air part. According to the drawn equipotential surface, a range of the equipotential surface may be determined. Since the entire probe sample model is axisymmetric, the action ranges of the near field are the same in the X direction and Y direction, while different in the Z direction. A finite element model is established in COMSOL, unused size information of a sample is set according to range information contained in the equipotential surface, and the potential distributions are compared before and after the material changing.

The present disclosure provides the following method for analyzing the transverse and longitudinal resolutions of two application examples of the contact probe and the non-contact probe:

1. Example 1—Spatial Resolution Analysis of Contact Probe

1.1 Longitudinal Spatial Resolution

FIG. 4 shows the equipotential surface of 0.1 V, and −2.86e-05 represents the lowest point of this equipotential surface. In the same way, the value in the x direction on the z=0 plane can be determined by taking a point in FIG. 4. Firstly, it is observed that whether changing the material below the equipotential surface will affect the potential distribution in the whole sample or not when the sample thickness is equal to the lowest point of the equipotential surface. In the finite element model, the top layer represents the air, the middle layer is silicon, and the underlying layer is varying materials. If the potential distribution before and after the material changing keeps unchanged, it means that the potential value is greater than or equal to the limit potential value. The limit potential value represents the critical potential value which will not affect the potential distribution in the sample as the material is changed. If the potential distribution before and after the material changing is inconsistent, it means that the potential value is less than the limit potential value.

According to the analysis of the results in FIG. 5, changing the underlying material has a significant influence on the potential distribution in the sample, so the limit potential value is less than the current potential value. After repeatedly adjustment of the potential value of the equipotential surface, the limit potential value is finally determined as 0.05 V, and FIG. 6 shows the position of the equipotential surface at 0.05 V. The potential distribution in the sample is shown in FIG. 7. At this moment, the influence of material changing on the potential distribution in the sample remains almost unchanged, so that the longitudinal resolution of the contact probe can be determined. At this moment, the characteristic length of the probe is 10 um, and its longitudinal resolution is 62.3 um.

1.2 For the Transverse Spatial Resolution, Similarly, the Transverse Resolution of the Probe is Analyzed Along the Same Line FIG. 8 shows the equipotential surface position at 0.05V, wherein −68e-05 represents an intersection point of the equipotential surface and the x axis, and this value represents the action radius of the near field on the horizontal plane.

A finite element model is established in COMSOL. The top layer is the air, the lower left corner is the silicon sample, and the lower right corner is the changed material. The potential distribution in the finite element sample and on its surface is as shown in FIG. 9. According to the analysis and comparison results in FIG. 9, it is determined that the limit potential value of transverse resolution is different from that of longitudinal resolution of the probe, so it is necessary to re-determine the limit potential value of the transverse spatial resolution of the probe.

By comparing the results of several simulations, when the potential value of the equipotential surface is set to 0.03 V, changing the material barely influences the potential distribution on the sample surface. FIG. 10 shows the equipotential surface position at 0.03 V, and FIG. 11 shows the potential distribution on the sample surface. At this moment, the transverse spatial resolution of the probe is 113 um*2=226 um (as the model is two-dimensionally axisymmetric). FIG. 12 shows the position of the equipotential surface in the sample at 0.05V when the probe has a characteristic length of 1 um. When the characteristic length of the control probe is 10 um, the longitudinal spatial resolution becomes around one tenth of the original resolution, which shows that the characteristic length of the probe plays a decisive role for the spatial resolution.

2. Example 2—Spatial Resolution Analysis of Non-Contact Probe

2.1 Longitudinal Spatial Resolution

The potential distribution in the sample at 0.02 V is taken firstly, which is as shown in FIG. 13.

FIG. 13 shows the action of electric field in samples when the characteristic length of probe tip is 10 um and the distance between probe samples is 5 um. As the distance between probe samples increases, the potential values distributed in the samples become smaller. It should be noted that the selected potential value of 0.02V is the value selected upon repeated adjustment. With this potential value, changing the material outside the action area of the electric field has no effect on the electric field formed by the probe. The model simulated in COMSOL is substantially consistent with the contact probe model, except that the equivalent sphere of the probe does not contact with the sample. The thickness of the intermediate-layer sample is 98.9 um calculated in FIG. 13. It can be seen from the curve diagram of potential distribution inside the sample in FIG. 14 that changing the underlying sample material has no effect on the electric field distributed in the sample under current conditions. Therefore, when the characteristic length of the probe is 10 um, and the distance between probe samples is 5um, the longitudinal resolution of the probe is 98.9 um. This is worse than the spatial resolution of 10 um contact probe, which means that the spatial resolution becomes worse with the increase of the probe sample spacing.

2.2 Transverse Spatial Resolution

Similar to the contact probe, for determining the limit potential value, the potential value selected for the longitudinal resolution cannot be used as the limit potential value of the transverse resolution. If 0.02V is still selected as the limit potential value, the material changing will have a great influence on the electric field distribution curve. If 0.01V is selected as the limit potential value, the electric field distribution curve is as follows. FIG. 15 shows the equipotential surface at 0.01V.

In the model in FIG. 16, the material on the left is silicon, and the material on the right is variable. 225 um shown in FIG. 16 is the width of the left material. By simulation in this way, the simulation results are as shown as the potential distribution on the sample surface in FIG. 16. It can be seen from the potential distribution curve on the sample surface that the material changing has little effect on the potential distribution on the sample surface when the width of the left material is 225 um. Therefore, when the characteristic length of the probe is 10 um, and the distance between probe samples is Sum, the transverse resolution of the probe is 225 um*2=450 um.

Technical effects provided in the present disclosure will be described in detail in combination with the simulation below.

In order to verify the correctness of the above method for analyzing the probe spatial resolution, the reflection of coaxial probe is simulated by HFSS to reflect the distribution size in the near-field area. The verification idea is to set the material size exceeding the resolution, and then observe the influence due to the material changing outside the resolution on the probe reflection. The analysis of the longitudinal resolution of the contact probe is taken as an example for verification and explanation.

FIG. 17 is a simulation model of the coaxial probe. The lower two-layer structure in the figure is a dual-layer material, with the top layer made of silicon and the lower layer made of varying materials. In the simulation environment, only the dielectric constant of the material is changed to represent the material change. The coaxial probe contacts with the material. The thickness of the top layer material is set to the longitudinal resolution and that smaller than the longitudinal resolution respectively, and then the reflection coefficient of the coaxial probe is observed.

Firstly, it is to analyze the case that the thickness of the top layer material is the longitudinal resolution. Simulation results are as shown in FIG. 18. It can be seen from the curve distribution in the figure that the S11 curve does not change obviously when the material is changed. It indicates that the material changing below the longitudinal resolution does not affect S11 across the entire model, thus proving the depth range of the near field action area, which is consistent with the simulation result in MATLAB.

Then, it is to analyze the case that the thickness of the top layer material is less than the longitudinal resolution. Simulation results are as shown in FIG. 19. It can be seen from the change of S11 curve in the figure that the material changing has an influence on S11 across the entire model, which indicates that the depth range of the near-field action area exceeds the thickness of the top layer material, so that the change of the lower layer material affects the reflection signal of the coaxial probe. This is also consistent with the simulation result in MATLAB. Through the analysis of the above two cases, the correctness is verified for the method for analyzing the spatial resolution of the contact coaxial probe.

The above description is only specific implementations of the present disclosure without limiting the scope of the present disclosure. Those skilled in the art shall realize that, within the technical scope disclosed in the present disclosure, any modification, equivalent alteration, improvement and the like falling within the spirit and principle scope of the present disclosure shall be covered in the protection scope of the present disclosure.

What is claimed is:

1. A method for analyzing a spatial resolution of a microwave near-field probe comprising:
    drawing a three-dimensional equipotential surface in a sample using an electric field formula calculated by a quasi-static theory;
    establishing an equivalent model of the sample using finite element analysis software, so as to change material characteristics in an area outside the three-dimensional equipotential surface;
    determining a near-field action range of the microwave near-field probe by observing an influence of changing materials on a potential distribution in the sample; and
    analyzing and calculating the spatial resolution of a microwave near-field scanning microscope.

2. The method for analyzing the spatial resolution of the microwave near-field probe according to claim 1, comprising:
    modeling the sample of the microscope by the quasi-static theory, and analyzing the potential distributions around a probe tip in air and in the sample by an image charge method based at least in part on a formula satisfying a near-field potential distribution in a non-contact case;
    determining equipotential surface with different potential values according to a formula, determining values of $Z_I$ and $X_I$ in a Z direction and in an X direction of the equipotential surface, wherein materials outside the area contained in this equipotential surface are changed and a potential calculated by the finite element analysis software does not change before and after the change, wherein $Z_I$ is a longitudinal resolution of the probe and also a maximum depth that is detected, and wherein $X_I$ is a transverse resolution of the probe and a region size that is detected on a horizontal plane;
    establishing an equivalent model for the sample by using the finite element analysis software, setting boundary conditions for calculating potential distributions in air and in the sample in the equivalent model, and respectively changing materials outside the $x>X_I$ and $z>Z_I$ areas, exporting data information of the potential distributions before and after the material change; and
    comparing potential distribution change curves by origin, wherein when the potential distribution curves are consistent before and after the material change, the longitudinal resolution and transverse resolution of the probe are determined.

3. The method for analyzing the spatial resolution of the microwave near-field probe according to claim 2, wherein the formula for determining the equipotential surface with different potential values is:

$$u = \frac{1}{2\pi(\varepsilon + \varepsilon_0)} \sum_{n=1}^{\infty} q_n \frac{1}{[x^2 + y^2 + (z - a_n)^2]^{1/2}}$$

wherein ε is a dielectric constant of the sample, $q_n$ is a charge amount at the nth mirror image, $a_n$ is a position of the nth image charge, and m is $(ε-1)/(ε+1)$.

4. A program storage medium for receiving user input, where a stored computer program enables an electronic device to:
   drawing a three-dimensional equipotential surface in a sample using an electric field formula calculated by a quasi-static theory;
   establishing an equivalent model of the sample using finite element analysis software, so as to change material characteristics in an area outside the three-dimensional equipotential surface;
   determining a near-field action range of a microwave near-field probe by observing an influence of changing materials on a potential distribution in the sample; and
   analyzing and calculating the spatial resolution of a microwave near-field scanning microscope.

5. A system for analyzing a spatial resolution of a microwave near-field probe implementing a method for analyzing the spatial resolution of the microwave near-field probe, comprising:
   an equipotential surface acquisition module used for drawing an equipotential surface in a sample by MATLAB;
   an equipotential surface range containing module used for determining a range of an equipotential surface according to the drawn equipotential surface;
   a potential distribution module used for establishing a finite element model in COMSOL, setting unused size information of the sample according to range information contained in the equipotential surface, and comparing a potential distribution before and after a material changing.

6. The system according to claim 5, wherein:
   the sample is modeled by the quasi-static theory, and the potential distributions around a probe tip in the air and in the sample are analyzed respectively by an image charge method, wherein a formula satisfies a near-field potential distribution in a non-contact case;
   the equipotential surface with different potential values is drawn according to a formula, and values $Z_I$ and $X_I$ are taken respectively in a Z direction and in an X direction of the equipotential surface, wherein when materials outside an area contained in the equipotential surface are changed and a potential calculated by the finite element model does not change before and after the change, $Z_I$ is a longitudinal resolution of the probe and also a maximum depth that is detected, and $X_I$ is a transverse resolution of the probe and a region size that is detected on a horizontal plane;
   an equivalent model is established for the sample by using the finite element model, boundary conditions are set for calculating potential distributions in the air and in the sample in the model, and by respectively changing materials outside the $x>X_I$ and $z>Z_I$ areas, data information of the potential distributions before and after the material change are respectively exported; and
   by comparing potential distribution change curves by origin, when potential distribution curves are consistent before and after the material change, a longitudinal resolution and a transverse resolution of the current probe are determined.

7. The system according to claim 6, wherein the formula for drawing the equipotential surface with different potential values is:

$$u = \frac{1}{2\pi(\varepsilon+\varepsilon_0)} \sum_{n=1}^{\infty} q_n \frac{1}{[x^2+y^2+(z-a_n)^2]^{1/2}}$$

wherein ε is a dielectric constant of the sample, $q_n$ is a charge amount at the nth mirror image, $a_n$ is a position of the nth image charge, and m is $(ε-1)/(ε+1)$.

* * * * *